US006340900B1

(12) United States Patent
Donnelly et al.

(10) Patent No.: US 6,340,900 B1
(45) Date of Patent: Jan. 22, 2002

(54) PHASE DETECTOR WITH MINIMIZED PHASE DETECTION ERROR

(75) Inventors: Kevin S. Donnelly, San Francisco; Thomas H. Lee, Cupertino; Tsyr-Chyang Ho, San Jose, all of CA (US)

(73) Assignee: Rambus, Inc., Los Altos, CA (US)

( * ) Notice: Subject to any disclaimer, the term of this patent is extended or adjusted under 35 U.S.C. 154(b) by 1241 days.

(21) Appl. No.: 08/582,045

(22) Filed: Jan. 2, 1996

Related U.S. Application Data

(63) Continuation of application No. 08/197,641, filed on Feb. 15, 1994, now abandoned.
(51) Int. Cl.$^7$ ................................................ H03K 5/26
(52) U.S. Cl. ................................................ 327/3; 327/7
(58) Field of Search .......................... 327/234, 236, 327/238, 244, 246, 254, 357, 359, 563, 228, 229, 52, 55, 1, 7, 2, 3, 382, 322

(56) References Cited

U.S. PATENT DOCUMENTS

| | | | |
|---|---|---|---|
| 3,617,855 A | * 11/1971 | Hisatsu | ............................ 327/7 |
| 3,675,139 A | 7/1972 | Guest | ......................... 329/104 |

(List continued on next page.)

FOREIGN PATENT DOCUMENTS

| | | | | |
|---|---|---|---|---|
| EP | 0 490 690 A1 | 6/1992 | ............ | H03F/3/45 |
| EP | 0 521 215 A1 | 1/1993 | ............ | G11B/20/10 |
| GB | 2 140 993 A | 12/1984 | ............ | H03D/13/00 |
| JP | 55035516 | 3/1980 | ............ | H03F/3/343 |
| JP | 5865515 | 4/1983 | | |
| JP | 9191906 | * 10/1984 | .................... | 327/7 |

OTHER PUBLICATIONS

Jeff Barrow, "Eliminate Oscillator From a Loop," Apr. 27, 1989, Electronic Design, pp. 107–108.

S. Khursheed Enam and Asad A. Adibi, "NMOS IC's for Clock and Data Regeneration in Gigabit–per–Second Optical–Fiber Receivers," Dec. 1992, vol. 27, IEEE Journal of Solid–State Circuits, pp. 1763–1774.

Jeff Sontag, and Robert Leonowich, "A Monolithic CMOS 10 MHz DPLL for Burst–Mode Data Retiming," 1990 IEEE International Solid–State Circuits Conference Digest of Technical Papers, 37th ISSCC, 4 pages.

PCT Written Opinion for International Application No. PCT/US95/01315, 6 pages (Jan. 19, 1996).

*Primary Examiner*—Dinh T. Le
(74) *Attorney, Agent, or Firm*—Lee & Hayes, PLLC

(57) ABSTRACT

A phase detector is described that includes a load circuit that presents both a high differential impedance and a low common mode impedance. The load circuit is coupled to (1) a power supply and (2) a first node and a second node. The first and second nodes form an output of the phase detector. A capacitive circuit has (1) a first capacitor coupled to the first node and ground and (2) a second capacitor coupled to the second node and ground. A first circuit is coupled to the first and second nodes for detecting a phase difference between a first signal and a second signal. A second circuit is coupled to the first and second nodes for detecting the phase difference between the first and second signals and for minimizing phase detection error of the first circuit such that the phase difference between the first and second signals can be detected with minimized phase detection error. Each of the first and second circuits receives the first and second signals and a reference signal. The second circuit is cross-coupled to the first circuit such that an error current generated by the second circuit cancels that generated by the first circuit such that the phase detector detects the phase difference between the first and second signals with minimized phase detection error.

16 Claims, 4 Drawing Sheets

U.S. PATENT DOCUMENTS

| | | | |
|---|---|---|---|
| 3,771,063 A | 11/1973 | Barret | 328/134 |
| 3,863,080 A | 1/1975 | Steckler | 307/235 |
| 4,156,851 A | 5/1979 | Winters | 328/155 |
| 4,178,554 A | 12/1979 | Sase et al. | 328/133 |
| 4,285,006 A | 8/1981 | Kurahashi et al. | 358/35 |
| 4,291,274 A | 9/1981 | Suzuki et al. | 328/133 |
| 4,364,082 A | 12/1982 | Tonomura et al. | 358/28 |
| 4,506,175 A | 3/1985 | Reitmeier et al. | 307/525 |
| 4,520,321 A | 5/1985 | Nakatsugawa et al. | 328/133 |
| 4,547,685 A * | 10/1985 | Wong | 327/55 |
| 4,623,805 A | 11/1986 | Flora et al. | 307/602 |
| 4,635,097 A | 1/1987 | Tatami | 358/13 |
| 4,721,904 A | 1/1988 | Ozaki et al. | 324/83 |
| 4,751,469 A | 6/1988 | Nakagawa et al. | 328/133 |
| 4,814,648 A * | 3/1989 | Hynecek | 307/497 |
| 4,868,512 A | 9/1989 | Bridgman | 328/133 |
| 4,870,303 A | 9/1989 | McGinn | 307/511 |
| 4,893,094 A | 1/1990 | Herold et al. | 331/1 A |
| 4,904,948 A | 2/1990 | Asami | 328/133 |
| 4,929,916 A | 5/1990 | Fukuda | 331/1 A |
| 4,937,476 A | 6/1990 | Bazes | 307/475 |
| 4,958,133 A | 9/1990 | Bazes | 330/253 |
| 4,963,817 A | 10/1990 | Kohiyama et al. | 324/83 D |
| 5,095,233 A | 3/1992 | Ashby et al. | 307/603 |
| 5,121,010 A | 6/1992 | Hoshizaki et al. | 307/528 |
| 5,128,554 A | 7/1992 | Hoshizaki | 307/262 |
| 5,148,113 A | 9/1992 | Wight et al. | 328/155 |
| 5,164,838 A | 11/1992 | Okuda | 358/326 |
| 5,179,303 A | 1/1993 | Searles et al. | 307/603 |
| 5,187,448 A | 2/1993 | Brooks et al. | 330/258 |
| 5,220,294 A | 6/1993 | Ichikawa | 331/17 |
| 5,223,755 A | 6/1993 | Richley | 307/603 |
| 5,248,946 A | 9/1993 | Murakami et al. | 330/253 |
| 5,252,865 A * | 10/1993 | Davenport et al. | 327/3 |
| 5,253,042 A | 10/1993 | Yasuda | 358/19 |
| 5,253,187 A | 10/1993 | Kaneko et al. | 364/560 |
| 5,309,047 A * | 5/1994 | Tiede et al. | 327/52 |
| 5,309,162 A | 5/1994 | Uematsu et al. | 342/372 |
| 5,351,000 A | 9/1994 | Farwell | 324/76.77 |
| 5,362,995 A | 11/1994 | Kubo | 327/65 |
| 5,394,024 A | 2/1995 | Buckenmaier et al. | 327/160 |
| 5,400,085 A | 3/1995 | Fujiwara et al. | 348/624 |
| 5,422,529 A * | 6/1995 | Lee | 527/536 |
| 5,422,918 A | 6/1995 | Varti et al. | 375/371 |
| 5,432,480 A | 7/1995 | Popescu | 331/11 |
| 5,440,274 A | 8/1995 | Bayer | 331/1 A |
| 5,825,209 A * | 10/1998 | Stark et al. | 327/3 |

\* cited by examiner

PHASE DETECTOR WITH MINIMIZED PHASE DETECTION ERROR

This is a continuation of application Ser. No. 08/197,641, filed Feb. 15, 1994, now abandoned.

FIELD OF THE INVENTION

The present invention pertains to the field of phase detection circuits. More particularly, this invention relates to a phase detector that relatively accurately detects the phase difference between two input signals having different voltage swing characteristics, wherein the phase detector substantially minimizes the phase detection error arising from parasitic capacitance.

BACKGROUND OF THE INVENTION

Phase detection circuits are typically used in computer systems and other electronic systems for detecting the phase difference between two input signals. For example, in a phase locked loop ("PLL") system, it is frequently desirable to generate a periodic signal waveform that is in a quadrature (i.e., 90 degree) phase relationship with a reference signal. This typically requires a phase detection circuit in the PLL system to detect any departure from the desired quadrature phase relationship between the two signals. The detected departure from the desired phase relationship between the two signals is typically referred to as quadrature phase error.

When the phase detection circuit detects the quadrature phase error, the amount of the quadrature phase error is then supplied to other circuits of the PLL system. These other circuits of the PLL system then compensate for the quadrature phase error of the two signals such that the desired quadrature phase relationship between the two signals is maintained. As is known, a PLL system is typically used to maintain stable frequency and phase characteristics of an input signal.

One type of prior art phase detection circuit for detecting the quadrature phase error of two signals is an exclusive-OR gate logic circuit. The exclusive-OR gate logic circuit detects the quadrature phase error by causing its average output voltage to be proportional to the quadrature phase error.

Disadvantages are, however, associated with the prior art exclusive-OR gate type quadrature phase detector. One disadvantage is that the prior art exclusive-OR gate type quadrature phase detector typically requires that its input signals have substantially similar voltage swing characteristics. If the input signals have different voltage swings, the average output voltage of the exclusive-OR gate typically cannot properly reflect the quadrature phase error detected.

Another disadvantage associated with such a prior art detector is that the prior art detector typically cannot accurately detect the quadrature phase error. This is often due to the fact that phase detection errors typically occur in the circuit during phase detection. One contributor to the phase detection errors is the parasitic capacitance in the circuit. Because of the unpredictable nature of the parasitic capacitance, it is often relatively difficult to compensate for the phase detection errors that arise from the parasitic capacitance.

SUMMARY AND OBJECTS OF THE INVENTION

One of the objects of the present invention is to provide a phase detector that accurately detects the phase difference between two input signals having different voltage swing characteristics.

Another object of the present invention is to provide a phase detector that substantially minimizes the phase detection error induced by the parasitic capacitance.

Another object of the present invention is to provide a phase detector that minimizes the phase detection error of the circuit by compensating for the parasitic capacitance that causes the phase detection error.

A further object of the present invention is to provide a phase detector for detecting the phase difference between a full voltage swing periodic signal and a low voltage swing quasi-differential or fully differential periodic signal, and for providing compensation for phase detection errors arising from parasitic capacitance such that substantially accurate measurement of the phase difference of the two signals can be obtained.

A phase detector is described that includes a load circuit that presents a high differential impedance and a low common mode impedance. The load circuit is coupled to (1) a power supply and (2) a first node and a second node. The first and second nodes form an output of the phase detector. A capacitive circuit has (1) a first capacitor coupled to the first node and ground and (2) a second capacitor coupled to the second node and ground. A first circuit is coupled to (1) the first and second nodes and (2) ground for detecting a phase difference between a first input signal and a second input signal. A second circuit is coupled to (1) the first and second nodes and (2) ground for detecting the phase difference between the first and second input signals and for minimizing phase detection error of the first circuit such that the phase difference between the first and second input signals can be detected with minimized phase detection error. Each of the first and second circuits receives the first and second input signals and a reference signal. The first and second circuits are cross-coupled such that an error current generated by the second circuit cancels that generated by the first circuit so that the phase detector detects the phase difference between the first and second signals with minimized phase detection error.

A phase detector is described that includes a load circuit that presents both a high differential impedance and a low common mode impedance. The load circuit is coupled to (1) a power supply and (2) a first node and a second node. The first and second nodes form an output of the phase detector. A capacitive circuit includes (1) a first capacitor coupled to the first node and ground and (2) a second capacitor coupled to the second node and ground. A first circuit is coupled to (1) the first and second nodes and (2) ground for detecting a phase difference between a first input signal and a second input signal. The first circuit has a first transistor coupled to the first node and a third node, a second transistor coupled to the second and third nodes, and a third transistor coupled to the third node and ground via a first current source. The first transistor receives the first input signal. The second transistor receives a reference signal. The third transistor receives the second input signal. The first and second signals have different voltage swing characteristics.

Other objects, features, and advantages of the present invention will be apparent from the accompanying drawings and from the detailed description that follows below.

BRIEF DESCRIPTION OF THE DRAWINGS

The present invention is illustrated by way of example and not limited to the figures of the accompanying drawings, in which like references indicate similar elements and in which.

DETAILED DESCRIPTION

Figure 1:
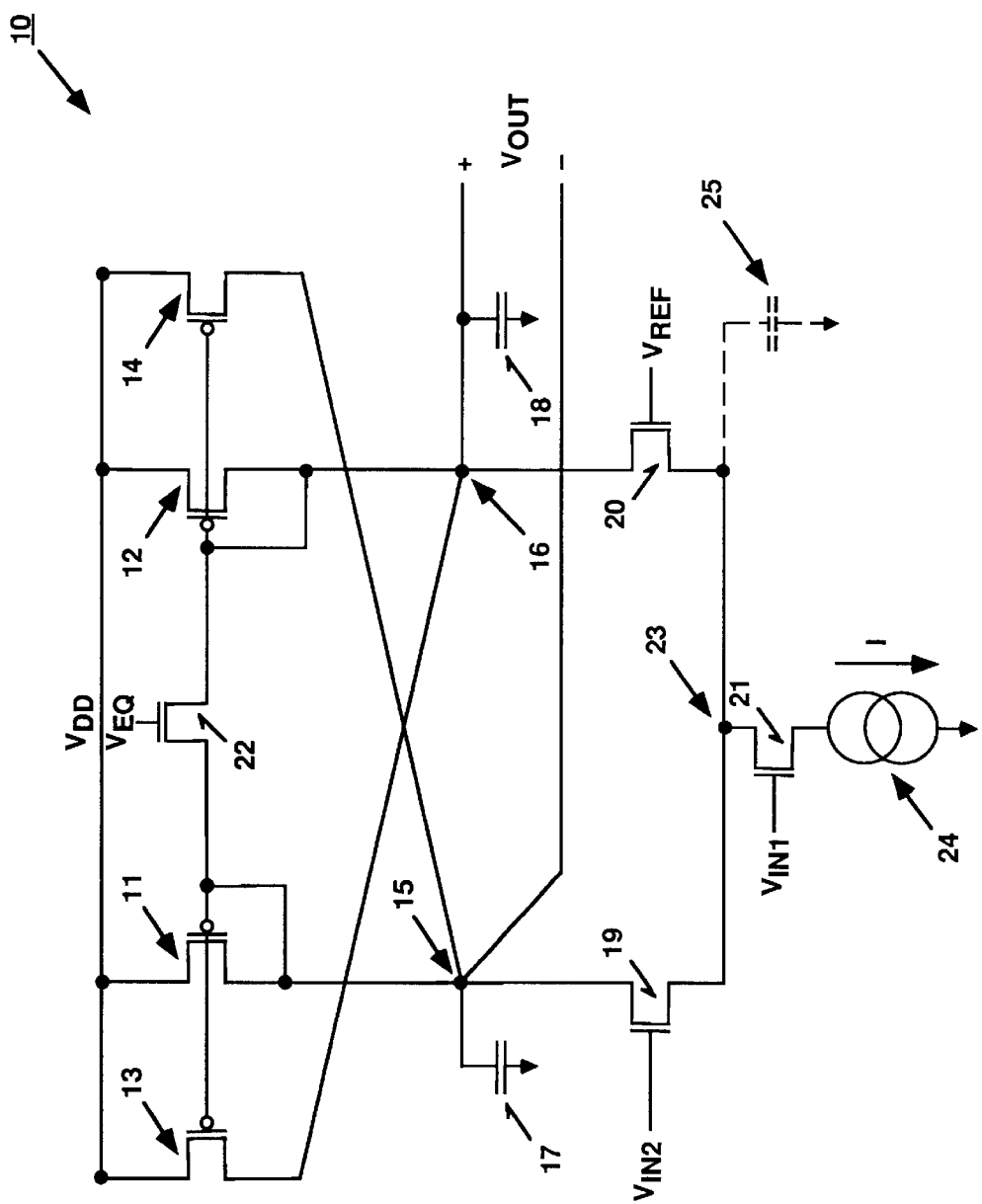
FIG. 1 illustrates a phase detector in accordance with one embodiment of the present invention.
Figure 3:
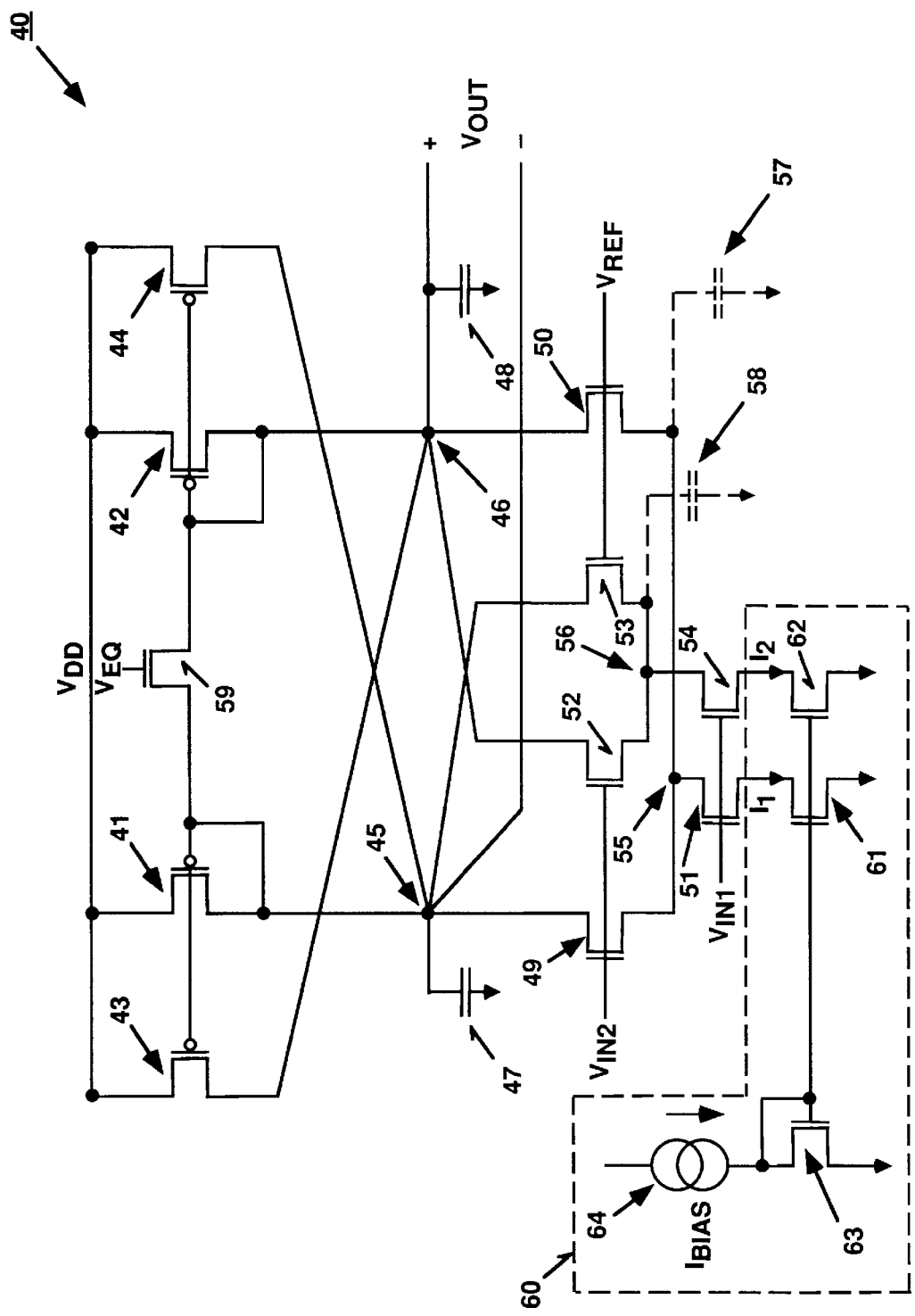
FIG. 3 is a circuit diagram of a phase detector in accordance with another embodiment of the present invention.

FIG. 1 illustrates the circuit of a quadrature phase detector 10 that implements one embodiment of the present invention. Phase detector 10 of FIG. 1 detects the quadrature phase error between two input signals that are in quadrature phase relationship and that have different voltage swing characteristics. FIG. 3 illustrates the circuit of another quadrature phase detector 40 that implements another embodiment of the present invention. Phase detector 40 minimizes the phase detection error induced by the parasitic capacitance. Phase detectors 10 and 40 will be described in more detail below.

Phase detector 10 shown in FIG. 1 includes transistors 11 through 14 and 19 through 21. For one embodiment, transistors 11–14 and 19–21 are metal oxide semiconductor field effect transistors ("MOSFETs") and are in a complementary metal oxide semiconductor ("CMOS") configuration. For other embodiments, transistors 11–14 and 19–21 can be N-channel MOSFET transistors or P-channel MOSFET transistors. For alternative embodiments, other devices, such as bipolar transistors, may be used.

For one embodiment shown in FIG. 1, transistors 11–14 are P-channel transistors that are connected as current sourcing transistors between a power supply voltage $V_{DD}$ and nodes 15 and 16. Alternatively, transistors 11–14 can be N-channel transistors or bipolar transistors.

Transistors 11–14 together constitute the load of phase detector 10. Transistors 11–14 present a high differential impedance between nodes 15–16 and a low common mode resistance from the power supply $V_{DD}$ to nodes 15–16. Diode connected transistors 11–12 serve as a low common mode resistance between the power supply $V_{DD}$ and nodes 15–16. Transistors 11–12 also constitute a positive differential load resistance between nodes 15 and 16. Transistors 13–14 constitute a negative differential load resistance between nodes 15 and 16. The negative differential load resistance cancels the positive differential load resistance. As a result, transistors 11–14 together present the high differential load resistance between nodes 15 and 16. The connection of transistors 11–14 is described below.

Alternatively, other types of load circuits can be used in phase detector 10 between the power supply $V_{DD}$ and nodes 15–16. In addition, the load formed by transistors 11–14 can be any other kind of high differential impedance load circuit.

The drain of transistors 11–14 are connected to node 15 and the drain of transistors 12 and 13 are connected to node 16. Each of transistors 11–12 has its gate coupled to its drain. In addition, the gate of transistor 13 is connected to the gate of transistor 11, and the gate of transistor 14 is connected to the gate of transistor 12. Because the gates of transistors 11 and 13 are connected together and the gates of transistors 12 and 14 are connected together, transistor 13 mirrors the current through transistor 11 and transistor 14 mirrors the current through transistor 12. In other words, transistors 11 and 13 constitute a current mirror and transistors 12 and 14 constitute another current mirror. By mirroring the current flowing through transistor 11 to node 16 and by mirroring the current flowing through transistor 12 to node 15, each of nodes 15–16 receives substantially the same amount of current and no differential current is generated. This therefore causes transistors 11–14 to present a high differential load resistance because the negative differential load resistance generated by transistors 13–14 cancels the positive differential load resistance generated by transistors 11–12.

For one embodiment, transistors 11–14 are substantially identical in size such that the negative differential load resistance generated by transistors 13–14 cancels the positive differential load resistance generated by transistors 11–12.

Nodes 15–16 form the output of phase detector 10. A capacitor 17 is connected between ground and node 15 and a capacitor 18 is connected to node 16 and ground. For one embodiment, capacitors 17 and 18 have substantially equivalent capacitance. For one embodiment, capacitors 17 and 18 include parasitic capacitances of transistors 11–14 at nodes 15–16, respectively. Alternatively, capacitors 17 and 18 may or may not comprise parasitic capacitances, such as those of transistors 11–14 at nodes 15–16, respectively.

Node 15 is further connected to the drain of transistor 19 and node 16 is further connected to the drain of transistor 20. The sources of transistors 19–20 are connected to a node 23. Node 23 is then connected to the drain of transistor 21. Transistor 21 has its source connected to ground via a current source 24. The gate of transistor 19 receives an input signal $V_{IN2}$. The gate of transistor 20 receives an input signal $V_{REF}$. The gate of transistor 21 receives an input signal $V_{IN1}$. Transistors 19–21 are N-channel transistors. Alternatively, transistors 19–21 can be P-channel transistors or bipolar transistors. For one embodiment, transistor 19 has a size that is substantially equal to that of transistor 20.

Figure 2:
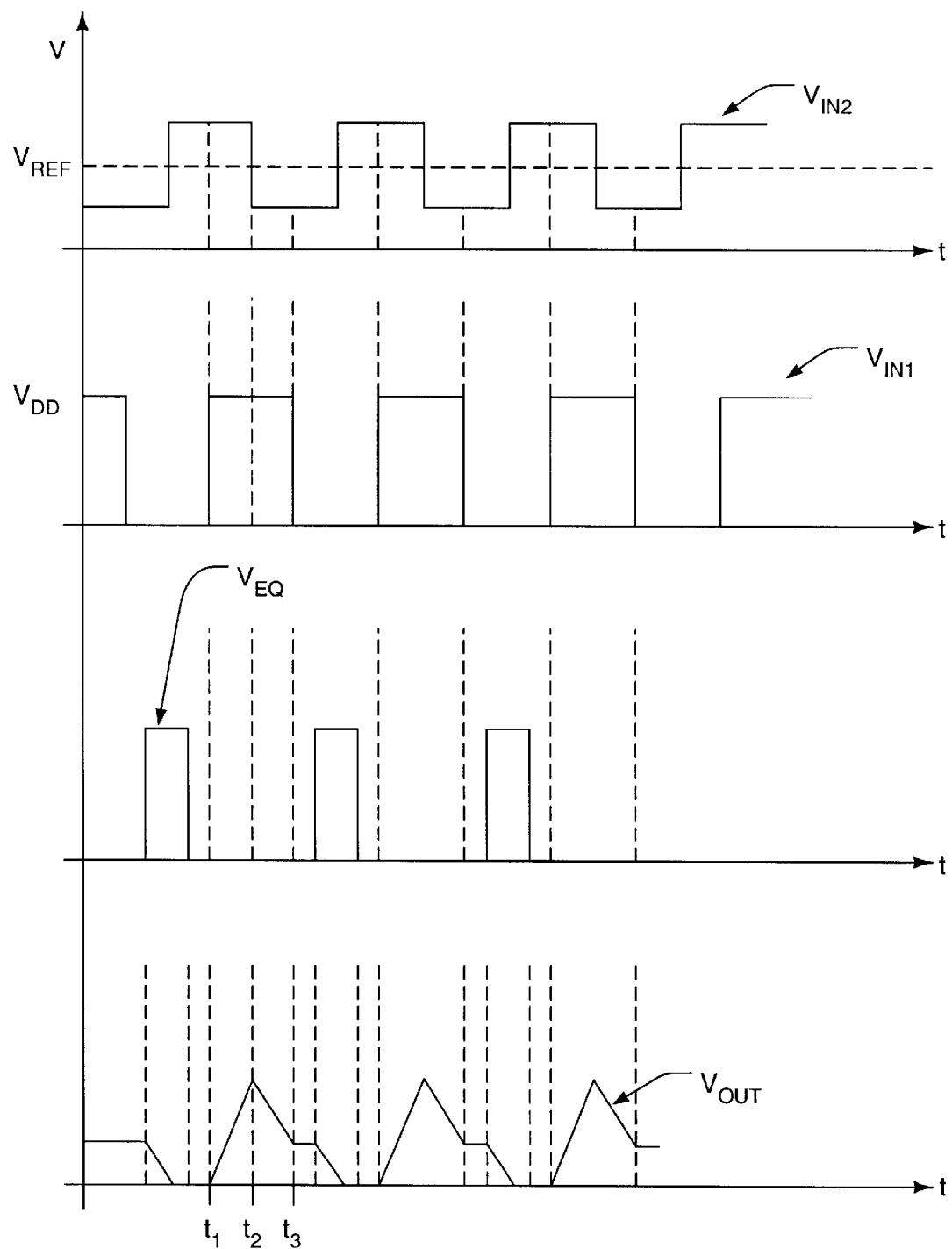
FIG. 2 illustrates the waveform of the output signal of the phase detector of FIG. 1 in view of various input signals.

As seen from FIG. 2, the $V_{IN1}$ signal exhibits a full CMOS voltage swing. The $V_{IN2}$ signal, however, is a small voltage swing signal that oscillates substantially symmetrically around the $V_{REF}$ reference voltage. As can be seen from FIG. 2, the $V_{REF}$ signal is a constant DC reference voltage. The $V_{IN2}$ signal is therefore referred to as quasi-differential signal. In other words, the $V_{IN2}$ and $V_{REF}$ signals are not complementary to each other. The $V_{IN1}$ and $V_{IN2}$ signals are shown in the quadrature phase relationship in FIG. 2.

Alternatively, the $V_{IN2}$ signal is a small swing, fully differential signal that swings between a $V_{high}$ voltage and a $V_{low}$ voltage. In this case, the $V_{REF}$ signal is complementary to the $V_{IN2}$ signal. In other words, when the gate of transistor 19 receives the $V_{high}$ voltage, the gate of transistor 20 receives the $V_{low}$ voltage.

Transistors 19–21 detect the quadrature phase error of the $V_{IN1}$ and $V_{IN2}$ input signals. It is desirable to have the $V_{IN1}$ and $V_{IN2}$ signals in a quadrature phase relationship. When quadrature phase error occurs (i.e., the desired quadrature phase relationship has not been achieved), phase detector 10 detects that condition by producing a net differential-voltage across nodes 15–16 (i.e., the output $V_{OUT}$) at the end of each measurement cycle. The voltage level of the net differential voltage across nodes 15–16 is a function of the amount of quadrature phase error between the $V_{IN1}$ and $V_{IN2}$ input signals. If phase detector 10 does not detect any quadrature phase error, phase detector 10 does not produce any net differential voltage across nodes 15–16 at the end of the detection cycle.

Phase detector 10 also includes a transistor 22 coupled between nodes 15–16. Transistor 22 is an N-channel MOSFET transistor. Alternatively, transistor 22 can be a P-channel MOSFET transistor or a bipolar transistor. Transistor 22 is used in phase detector 10 as an equalizing transistor. Transistor 22 causes the voltage difference across nodes 15–16 to be zero when transistor 22 conducts before a measurement cycle is initiated. As can be seen from FIG. 1, transistor 22 is switched on or off by the $V_{EQ}$ signal. When transistor 22 is turned on by the $V_{EQ}$ signal, nodes 15 and 16 are connected together via transistor 22 and the voltages at nodes 15–16 are equalized.

FIG. 2 also illustrates the signal waveform of the $V_{EQ}$ signal. As can be seen from FIG. 2, the $V_{EQ}$ signal can be a periodic pulse signal that occurs before every pulse of the $V_{IN1}$ signal. The $V_{EQ}$ signal helps to equalize the voltages across nodes 15–16 for starting a detection cycle. Alternatively, the pulse cycle of the $V_{EQ}$ signal can occur before every Nth pulse of the $V_{IN1}$ signal.

Referring to FIGS. 1–2, the operation of phase detector 10 is now described. As shown in FIG. 1, transistor 21 connects a current I from node 23 to current source 24 when the $V_{IN1}$ signal is at the high $V_{DD}$ voltage. Because transistor 21 is connected to current source 24, transistor 21, when conducting, only allows the amount of current I to flow through. The $V_{IN1}$ signal controls the start of each detection cycle. Whenever the voltage level of the $V_{IN1}$ signal rises to the $V_{DD}$ voltage, a detection cycle is initiated.

When the voltage level of the $V_{IN2}$ signal is higher than that of the $V_{REF}$ voltage and when the $V_{IN1}$ signal is at the $V_{DD}$ voltage (e.g., from time $t_1$ to time $t_2$), transistor 19 conducts more than transistor 20 does. Transistor 19 thus contributes substantially all the I current to node 23. Because each of nodes 15 and 16 receives substantially the same amount of current from the load element formed by transistors 11–14, capacitor 17 is charged differently than capacitor 18 if transistors 19 and 20 are not drawing the same amount of current to node 23. In this case, capacitor 18 may be charging while capacitor 17 is discharging. This in turn generates a differential voltage across nodes 15–16, and therefore at the output $V_{OUT}$ of phase detector 10. The differential voltage at the output $V_{OUT}$ ramps linearly upwards for the time that the voltage of the $V_{IN2}$ signal is higher than the $V_{REF}$ reference voltage (e.g., from time $t_1$ to time $t_2$ in FIG. 2). The signal waveform of the $V_{OUT}$ signal is also shown in FIG. 2.

When the voltage level of the $V_{IN2}$ signal is lower than that of the $V_{REF}$ voltage and when the $V_{IN1}$ signal is at the $V_{DD}$ voltage (e.g., from time $t_2$ to time $t_3$), transistor 20 then contributes substantially all the I current to node 23. This in turn causes the charging of capacitors 17–18 to be uneven. In this case, capacitor 17 may be charging while capacitor 18 is discharging. This then results in the differential voltage at the output $V_{OUT}$ of phase detector 10 to drop linearly downwards (see the waveform of the $V_{OUT}$ signal in FIG. 2).

When the voltage level of the $V_{IN1}$ signal goes to ground, the differential voltage at the output $V_{OUT}$ stops changing. If the $V_{IN1}$ and $V_{IN2}$ signals are in perfect quadrature, the differential voltage across nodes 15–16 ramps linearly towards zero and no net differential voltage will be developed at the $V_{OUT}$ output of phase detector 10 at the time when the $V_{IN1}$ signal goes to ground (e.g., at time $t_3$). If, however, a quadrature phase error exists between the $V_{IN1}$ and $V_{IN2}$ signals, a net differential voltage will be developed across nodes 15–16 at the end of the phase detection cycle (e.g., from time $t_1$ to time $t_3$). The net differential voltage across nodes 15–16 is substantially proportional to the amount of the quadrature phase error.

The output $V_{OUT}$ of phase detector 10 can be connected to a comparator to generate a binary quadrature phase error output. Other circuits may also be used to generate the binary quadrature phase error output.

The above description of phase detector 10 in detecting the quadrature phase error assumes the desirable situation in which the influence of any parasitic capacitance of transistors 19 through 21 at node 23 is neglected. As can be seen from FIG. 1, phase detector 10, however, includes a parasitic capacitor 25 coupled between node 23 and ground. Parasitic capacitor 25 includes the parasitic capacitance of transistors 19–21 at node 23, as well as other parasitic capacitances. Because transistor 21 is used as a switch, parasitic capacitor 25 includes the parasitic capacitance between the source of transistor 21 and ground.

Due to the existence of parasitic capacitor 25 in the circuit of phase detector 10, phase detector 10 generates a net differential voltage at the output $V_{OUT}$ of the circuit at the end of a detection cycle even when the $V_{IN1}$ and $V_{IN2}$ signals are in the perfect quadrature phase relationship, as can be seen from FIG. 2 (e.g., at time $t_3$). The generation of the net differential voltage at the $V_{OUT}$ output of phase detector 10 by parasitic capacitor 25 is described below.

As can be seen from FIG. 1, due to parasitic capacitor 25, the voltage level at node 23 does not change immediately after transistor 21 is turned on by the $V_{IN1}$ signal, causing the current flowing through transistor 21 to exceed the current I, which generates an additional error current. Because the voltage level of the $V_{IN2}$ signal is higher than the $V_{REF}$ voltage, this additional error current flows through transistor 19. This in turn causes capacitor 17 to be additionally discharged by the additional error current, which results in the differential voltage at the output $V_{OUT}$ to be ramped higher.

When, however, the voltage level of the $V_{IN2}$ signal drops below the $V_{REF}$ voltage, transistor 19 is much less conducting than transistor 20, and transistor 20 contributes substantially all the I current to node 23. The voltage level at node 23 falls. This causes parasitic capacitor 25 to be discharged, reducing the current flowing through transistor 20, which generates an additional error current flowing through transistor 20 to capacitor 18. This additional error current causes capacitor 18 to be additionally charged.

In addition, due to parasitic capacitor 25, the voltage level at node 23 does not change immediately after transistor 21 is turned off by the $V_{IN1}$ signal, causing an additional error current to flow through transistor 20 to parasitic capacitor 25. This additional error current causes capacitor 18 to be additionally discharged.

As a result, all the above-described error currents in charging capacitors 17–18 cause a net differential voltage at the output $V_{OUT}$ of phase detector 10 at the end of a detection cycle even when the $V_{IN1}$ and $V_{IN2}$ signals are in the perfect quadrature phase relationship, as can be seen from FIG. 2. When this occurs, a phase detection error occurs. Because of the unpredictable nature of the parasitic capacitance, the voltage level of the net differential voltage due to the parasitic capacitance also cannot be predicted.

Phase detector 40 of FIG. 3 eliminates the net differential voltage occurring at the output of the circuit due to the parasitic capacitance.

As can be seen from FIG. 3, phase detector 40 includes transistors 41 through 44 connected between the power supply $V_{DD}$ and nodes 45 and 46. The connection and function of transistors 41–44 in phase detector 40 are identical to that of transistors 11–14 in phase detector 10 of FIG. 1, and therefore will not be described in more detail below.

Node 45 is connected to capacitor 47 and capacitor 48 is connected to node 46. The capacitance of capacitor 48 is substantially equal to that of capacitor 47. Nodes 45–46 are then connected to a first circuit formed by transistors 49 through 51 and a second circuit formed by transistors 52 through 54. Transistors 51 and 54 are then connected to a circuit 60, which essentially includes a first current source for providing a first current $I_1$ through transistors 51 and a second current source for providing a second current $I_2$ through transistor 54, as can be seen from FIG. 3. Both the $I_1$ and $I_2$ currents are generated and controlled by a $I_{BIAS}$ current.

Circuit 60 generates the $I_1$ and $I_2$ currents. The value of the $I_2$ current is smaller than that of the $I_1$ current. For one embodiment, the value of the $I_2$ current is in a range of 20% to 30% of the $I_1$ current. For alternative embodiments, the value of the $I_2$ current can be larger or smaller than 20% to 30% of the $I_1$ current.

For one embodiment, transistors 49–51 and 52–54 are N-channel MOSFET transistors. For alternative embodiments, transistors 49–51 and 52–54 can be P-channel MOSFET transistors or bipolar transistors. For one embodiment, the size of each of transistors 52–53 is substantially equal to that of each of transistors 49–50 and the size of transistor 54 is substantially equal to that of transistor 51.

Figure 4:
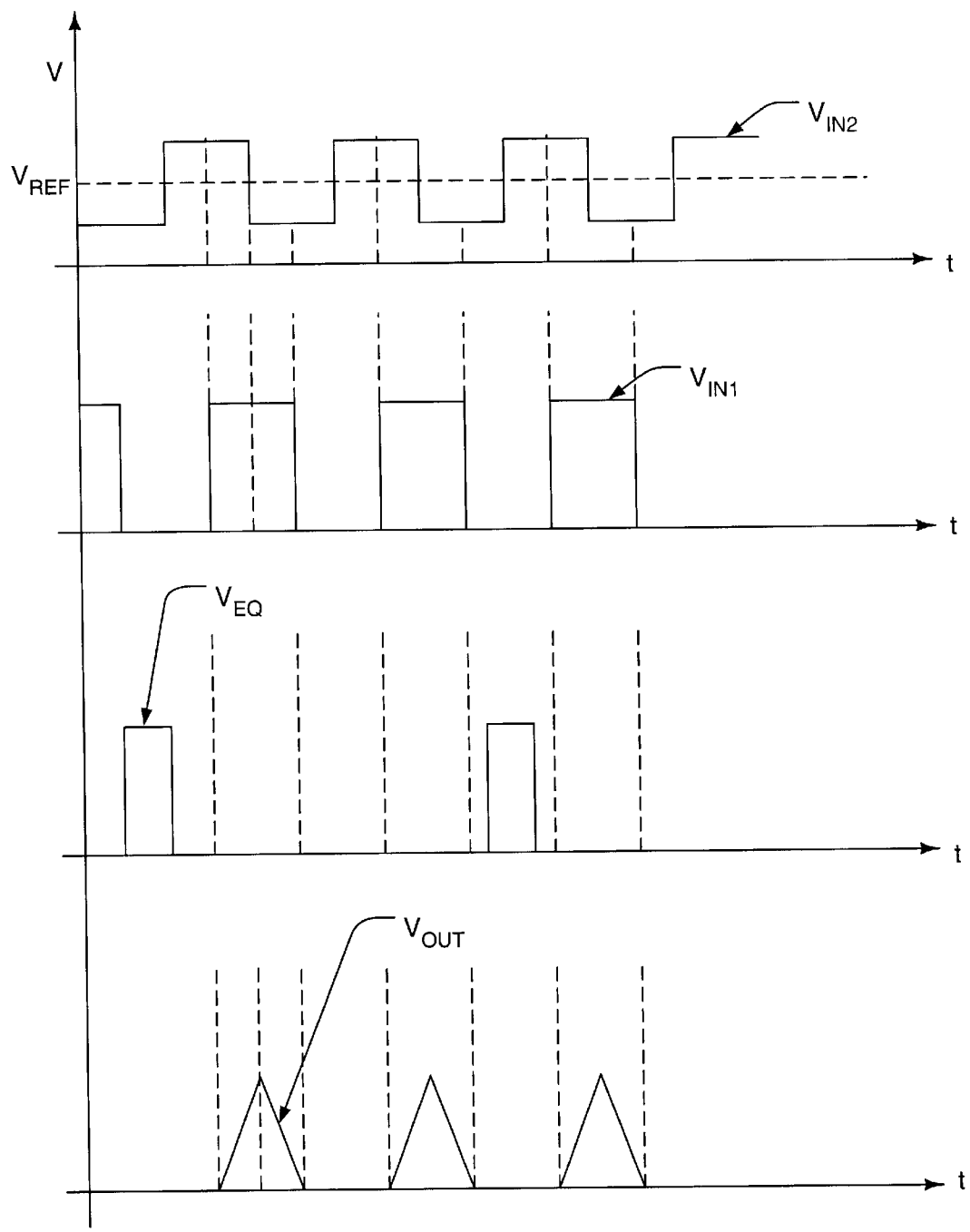
FIG. 4 illustrates the waveform of the output signal of the phase detector of FIG. 3 in view of various input signals.

Transistor 49 is connected to node 45 and node 55. Transistor 50 is connected to nodes 46 and 55. Transistor 51 connects node 55 to ground via the current source $I_1$ formed by circuit 60. Similarly, transistor 52 is connected to node 46 and a node 56. Transistor 53 is connected to nodes 45 and 56. Transistor 54 connects node 56 to ground via the current source $I_2$ formed by circuit 60. The gate of each of transistors 51 and 54 receives the $V_{IN1}$ signal. The gate of each of transistors 49 and 52 receives the $V_{IN2}$ signal and the gate of each of transistors 50 and 53 receives the $V_{REF}$ voltage. The $V_{IN1}$ and $V_{IN2}$ signals and the $V_{REF}$ voltage are identical to those described above and shown in FIGS. 1–2. FIG. 4 also illustrates the signal waveforms of these signals.

FIG. 3 also illustrates a parasitic capacitor 57 connected to node 55 and ground and a parasitic capacitor 58 connected to node 56 and ground. Parasitic capacitor 57 includes the parasitic capacitance of transistors 49–51 at node 55 and parasitic capacitor 58 includes the parasitic capacitance of transistors 52–54 at node 56. Parasitic capacitor 57 also includes other parasitic capacitances. Because transistor 51 is used as a switch, parasitic capacitor 57 includes the parasitic capacitance between the source of transistor 51 and ground. Likewise, parasitic capacitor 58 also includes other parasitic capacitances. Because transistor 54 is used as a switch, parasitic capacitor 58 includes the parasitic capacitance between the source of transistor 54 and ground.

Transistors 49–51 detect the phase error of the $V_{IN1}$ and $V_{IN2}$ signals. Transistors 52–54 cancel the net differential voltage at the output $V_{OUT}$ of phase detector 40 due to parasitic capacitor 57 in the circuit. As described above, each of transistors 52–53 has a size that is substantially equal to that of each of transistors 49–50. Therefore, the capacitance of parasitic capacitor 58 is substantially equal to that of parasitic capacitor 57. Due to the negative cancellation effect of transistors 52–54, the additional error currents generated in the circuit due to parasitic capacitors 57–58 cancel each other and phase detector 40 of FIG. 3 does not experience any net differential voltage generated at the output $V_{OUT}$ of the circuit due to the parasitic capacitance. Because the capacitance of parasitic capacitors 57–58 is substantially equal, the additional error currents associated with parasitic capacitors 57–58 are also substantially equal.

Transistors 49–50 and 52–53 are, however, cross-connected such that their respective contributions subtract from each other. This causes the additional error currents to cancel each other. This thus allows phase detector 40 to detect the quadrature phase error of the $V_{IN1}$ and $V_{IN2}$ signals with minimized phase detection error.

The operation of transistors 52–54 is described below, in conjunction with FIGS. 3 and 4. As can be seen from FIG. 3, when transistor 51 is turned on by the logical high $V_{IN1}$ signal, the voltage level at node 55 does not change immediately, causing the current flowing through transistor 51 to exceed the current $I_1$, which generates an additional error current. Because the voltage level of the $V_{IN2}$ signal is higher than the $V_{REF}$ voltage at this time, this additional error current flows through transistor 49, causing capacitor 47 to be additionally discharged. Meanwhile, because transistor 54 is also turned on by the logical high $V_{IN1}$ signal, the voltage level at node 56 does not change immediately, which also generates an additional error current flowing through transistor 54. As the voltage level of the $V_{IN2}$ signal is higher than the $V_{REF}$ voltage at this time, an additional error current flows through transistor 52, causing capacitor 48 to be additionally discharged. Because the capacitance of parasitic capacitor 57 is equal to that of parasitic capacitor 58, the additional error current that flows through transistor 52 is substantially equal to the additional error current through transistor 49. Given that transistor 52 is connected to node 46 while transistor 49 is connected to node 45, the additional error current generated by transistor 52 cancels that generated by transistor 49.

When the voltage level of the $V_{IN2}$ signal is lower than that of the $V_{REF}$ voltage, transistor 49 is much less conducting than transistor 50 and transistor 52 is much less conducting than transistor 53. The voltage level at each of nodes 55 and 56 falls. This causes parasitic capacitors 57 and 58 to be discharged, reducing the current flowing through transistors 50 and 53, respectively. This then causes an additional error current to flow through transistor 50 to capacitor 48 and an additional current to flow through transistor 53 to capacitor 47, additionally charging capacitors 47 and 48, respectively. Given that transistor 50 is connected to node 46 and transistor 53 is connected to node 45 and given that the additional error currents through transistors 50 and 53 are substantially equal to each other, the additional charging to each of capacitors 47 and 48 cancels each other.

In addition, due to parasitic capacitors 57 and 58, the voltage level at each of nodes 55 and 56 does not change immediately after transistors 51 and 54 are turned off by the $V_{IN1}$ signal, causing an additional error current to flow through transistor 50 to parasitic capacitor 57 and an additional error current to flow through transistor 53 to parasitic capacitor 58. The additional error currents cause capacitors 47 and 48 to be additional discharged, respectively. Because the capacitance of parasitic capacitor 57 is substantially equal to that of parasitic capacitor 58, the additional error current flowing through transistor 50 is substantially equal to the additional error current flowing through transistor 53. Given that transistor 50 is connected to node 46 and transistor 53 is connected to node 45, the additional error currents cancel each other. By doing so, no net differential voltage due to parasitic capacitor 58 will be developed at the output $V_{OUT}$ and phase detector 40 detects the quadrature phase error of the $V_{IN1}$ and $V_{IN2}$ signals with minimized detection error. The signal waveform of the $V_{OUT}$ signal of phase detector 40 is shown in FIG. 4.

The $V_{OUT}$ output of phase detector 40 can also be connected to a comparator to generate a binary quadrature phase error output. Alternatively, other circuits can be used to generate the binary quadrature phase error output.

Phase detector 40 also includes an equalizing transistor 59 connected between nodes 45–46. Transistor 59 ensures that phase detector 40 initiates a phase detection cycle with a zero differential voltage at the output $V_{OUT}$, and is controlled by the $V_{EQ}$ signal.

The generation of the $V_{EQ}$ signal can be controlled by a clock signal. Therefore, various clocking protocols can be used to generate the $V_{EQ}$ signal pulses. For example, to increase sensitivity in some applications, the measurement can take place over a number of clock cycles. In those cases, the $V_{EQ}$ pulse is generated such that transistor 59 is activated only once every N clock cycles, wherein N is the number of clock cycles during which the phase error measurement is allowed to integrate.

For one embodiment, N is equal to two, as shown in FIG. 4. For alternative embodiments, N can be larger than two.

Thus, the phase detector described above includes first and second circuits that are constructed in substantially the same way and receive the same input signals. The first and second circuits are, however, cross-coupled together such that the error current generated by the second circuit cancels that generated by the first circuit in order to allow the circuit to perform the designated function with minimized error.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A phase detector, comprising:
    (A) a load circuit formed by transistors and coupled to (1) a power supply and (2) a first node and a second node, wherein the first and second nodes form an output of the phase detector;
    (B) a capacitive circuit having (1) a first capacitor coupled to the first node and ground and (2) a second capacitor coupled to the second node and the ground;
    (C) a first circuit having a first end coupled to the first node and a second end coupled to the second node, the first circuit detecting a phase difference between a first signal and a second signal, wherein the first circuit causes a first error current;
    (D) a second circuit having the same circuit configuration as the first circuit but having a first end coupled to the second node and a second end coupled to the first node, wherein the second circuit causes a second error current that cancels the first error current due to cross-connection of the second circuit with respect to the first circuit, wherein each of the first and second circuits receives the first and second signals, wherein the first and second circuits are controlled by the second signal to function with respect to the first and second signals at the same time such that the second error current cancels the first error current in order for the first circuit to detect the phase difference between the first and second signals with minimized detection error.

2. The phase detector of claim 1 wherein the first circuit includes a first transistor coupled to the first node and a third node, a second transistor coupled to the second and third nodes, and a third transistor coupled to the third node and the ground via a first current source, wherein the second circuit includes a fourth transistor coupled to the first node and a fourth node, a fifth transistor coupled to the second and fourth nodes, and a sixth transistor coupled to the fourth node and the ground via a second current source such that the second error current cancels the first error current, wherein the first and fifth transistors receive the first signal, the second and fourth transistors receive a reference signal, and the third and sixth transistors receive the second signal.

3. The phase detector of claim 2, wherein the sixth transistor has a size that is substantially equal to that of the third transistor, and each of the fourth and fifth transistors has a size that is substantially equal to that of each of the first and second transistors.

4. The phase detector of claim 2, wherein each of the first, second, third, fourth, fifth, and sixth transistors is a N-channel transistor.

5. The phase detector of claim 1, wherein the circuit presents both a high differential impedance and a low common mode impedance, wherein the load circuit further comprises
    (i) first current sourcing transistor coupled between the power supply and the first node and a second current sourcing transistor coupled between the power supply and the second node;
    (ii) a third current sourcing transistor coupled between the power supply and the second node and a fourth current sourcing transistor coupled between the power supply and the first node, wherein the third current sourcing transistor mirrors the current flowing through the first current sourcing transistor and the fourth current sourcing transistor mirrors the current flowing through the second current sourcing transistor.

6. The phase detector of claim 1, further comprising an equalizing transistor for equalizing the voltage level between the first and second nodes, wherein when the equalizing transistor is turned on, the equalizing transistor electrically connects the first node to the second node such that the voltage level between the first and second nodes is substantially equal.

7. The phase detector of claim 1, wherein the first and second signals are of different voltage swing, wherein the reference signal is a reference voltage signal with respect to the first signal.

8. The phase detector of claim 1, wherein the second signal and the reference signal are complementary with respect to each other.

9. A phase detector, comprising:
    (A) a load circuit presenting a high differential impedance and a low common mode impedance, wherein the load circuit is formed by a first set of transistors coupled to a power supply and a first node and a second set of transistors coupled to the power supply and a second node, wherein the first and second nodes form an output of the phase detector, wherein each of the first set of transistors has a control terminal coupled to the first node and each of the second set of transistors has a control terminal coupled to the second node;
    (B) a capacitive circuit having (1) a first capacitor coupled to the first node and ground and (2) a second capacitor coupled to the second node and the ground;
    (C) a first circuit coupled to the first and second nodes, the first circuit detecting a phase difference between a first signal and a second signal, wherein the first circuit includes a first transistor coupled to the first node and a third node, a second transistor coupled to the second and third nodes, and a third transistor coupled to the third node and the ground via a first current source, wherein the first transistor receives the first signal, the second transistor receives a reference signal, and the third transistor receives the second signal, wherein the first and second signals are of different voltage swing characteristics; and (D) an equalizing transistor coupled to the first and second nodes, the equalizing transistor equalizing the voltage level between the first and second nodes, wherein when the equalizing transistor is turned on, the equalizing transistor electrically connects the first node to the second node.

10. The phase detector of claim 9, further comprising a second circuit coupled to the first and second nodes for detecting the phase difference between the first and second signals and for minimizing phase detection error of the first circuit such that the phase difference between the first and second signals can be detected with minimized phase detection error, wherein the second circuit includes a fourth transistor coupled to the first node and a fourth node, a fifth transistor coupled to the second and fourth nodes, and a sixth transistor coupled to the fourth node and the ground via a second current source, wherein the fourth transistor receives the reference signal, the fifth transistor receives the first signal, and the sixth transistor receives the second signal such that a phase detection error generated by the second circuit cancels that generated by the first circuit so that the phase detector detects the phase difference between the first and second signals with minimized phase detection error.

11. The phase detector of claim 10, wherein the sixth transistor has a size that substantially equal to that of the third transistor, and each of the fourth and fifth transistors has a size that is substantially equal to that of each of the first and second transistors, wherein the second current source has a current that is proportional to that of the first current source.

12. The phase detector of claim 10, wherein each of the first, second, third, fourth, fifth, and sixth transistors is an N-channel transistor.

13. The phase detector of claim 10, wherein the load circuit further comprises (i) a first current sourcing transistor coupled between the power supply and the first node and a second current sourcing transistor coupled between the power supply and the second node;

(ii) a third current sourcing transistor coupled between the power supply and the second node and a fourth current sourcing transistor coupled between the power supply and the first node, wherein the third current sourcing transistor mirrors the current flowing through the first current sourcing transistor and the fourth current sourcing transistor mirrors the current flowing through the second current sourcing transistor.

14. The phase detector of claim 9, wherein the first and second signals are of different voltage swing, wherein the reference signal is a reference voltage signal with respect to the first signal.

15. The phase detector of claim 14, wherein the second signal and the reference signal are complementary with respect to each other.

16. A circuit, comprising:

(A) a load circuit formed by transistors and coupled to (1) a power supply and (2) a first node and a second node, wherein the first and second nodes form an output of the circuit;

(B) a capacitive circuit having (1) a first capacitor coupled to the first node and ground and (2) a second capacitor coupled to the second node and the ground;

(C) a first circuit having a first end coupled to the first node and a second end coupled to the second node, the first circuit integrating a first signal under control of a second signal, wherein the first circuit causes a first error current;

(D) a second circuit having the same circuit configuration as the first circuit but having a first end coupled to the second node and a second end coupled to the first node, wherein the second circuit causes a second error current that cancels the first error current due to cross-connection of the second circuit with respect to the first circuit, wherein each of the first and second circuits receives the first and second signals, wherein the first and second circuits are controlled by the second signal to function with respect to the first and second signals at the same time such that the second error current cancels the first error current in order for the first circuit to integrate the first signal under control of the second signal with minimized error.

* * * * *

UNITED STATES PATENT AND TRADEMARK OFFICE
CERTIFICATE OF CORRECTION

PATENT NO. : 6,340,900 B1
DATED : January 22, 2002
INVENTOR(S) : Donnelly et al

It is certified that error appears in the above-identified patent and that said Letters Patent is hereby corrected as shown below:

Column 10,
Line 15, replace "a" with -- an --.
Line 17, insert -- load -- between "the" and "circuit".

Column 11,
Line 31, insert -- is -- between "that" and "substantially".

Signed and Sealed this

Twenty-fifth Day of February, 2003

JAMES E. ROGAN
*Director of the United States Patent and Trademark Office*